US006197145B1

(12) United States Patent
Todd et al.

(10) Patent No.: US 6,197,145 B1
(45) Date of Patent: Mar. 6, 2001

(54) METHOD OF LAMINATING A FLEXIBLE CIRCUIT TO A SUBSTRATE

(75) Inventors: Michael George Todd, Anaheim Hills, CA (US); Rexanne M. Coyner, Farmington Hills, MI (US); Andrew Zachary Glovatsky, Livonia, MI (US); Daniel Phillip Dailey; Robert Edward Belke, both of West Bloomfield, MI (US)

(73) Assignee: Ford Motor Company, Dearborn, MI (US)

( * ) Notice: Subject to any disclaimer, the term of this patent is extended or adjusted under 35 U.S.C. 154(b) by 0 days.

(21) Appl. No.: 09/134,729

(22) Filed: Aug. 17, 1998

(51) Int. Cl.$^7$ ..................................................... H05K 3/00
(52) U.S. Cl. .................. 156/245; 156/324.4; 156/308.6; 156/307.1; 29/841; 29/848
(58) Field of Search ..................................... 156/245, 321, 156/311, 324.4, 308.6, 308.2, 307.1; 264/259, 241, 255, 250; 29/841, 848, 849

(56) References Cited

U.S. PATENT DOCUMENTS

| 5,118,458 | 6/1992 | Nishihara et al. ................... 264/155 |
| 5,220,488 | 6/1993 | Denes ..................................... 361/398 |
| 5,233,753 | 8/1993 | Wolf et al. . | |
| 5,461,202 | 10/1995 | Sera et al. ............................ 174/254 |

OTHER PUBLICATIONS

Patent Abstract of JP 6335940, "Manufacture of Integrated Printed–Wiring Board Molding", Dainippon Printing Co. Ltd., Published Dec. 6, 1994.

Patent Abstract of JP, vol. 18, No. 230 (E1542), "Integral Printed Circuit Board Molded Form and Manufacture thereof", Apr. 26, 1994, p. 8 and JP 6–21594 Dainippon Printing Co. LTd.

Patent Abstract of JP, vol. 17, No. 192(E1350), "Method And Apparatus For Manufacturing Injection Molded Printed Wiring", Apr. 14, 1993, p. 24 and JP4–337692, Nitto Boseki Co. Ltd.

Patent Abstract of JP, vol. 13, No. 304(E786), "Injection Molding of Printed Circuit Board", Jul. 12, 1989, p. 97 and JP1–81392, Meiki Co. LTd.

*Primary Examiner*—Francis J. Lorin
(74) *Attorney, Agent, or Firm*—Charles H. Ellerbrock

(57) ABSTRACT

A method of attaching a flexible plastic film having electronic circuit traces to a rigid plastic substrate. The film and substrate are made from different incompatible plastic materials that do not bond to one another and have different CTE. The use of different or incompatible materials is useful where the properties of the backing structure and film are selected to achieve different results. For example, the flexible film may be selected from a material that provides a high melting point to withstand soldering while the backing material is selected from a low-cost and light weight plastic material that has a lower melting point. The film has conductive traces on at least one surface thereof and a backing surface. A heat activated adhesive is applied to the backing surface. The film is placed within an open injection mold and the mold is closed. A hot plastic resin is injected into the mold adjacent the adhesive. The resin heats the adhesive above its activation temperature and causes the adhesive to bond to both the backing surface and the plastic resin. The resin is allowed to cool and the finished circuit assembly is removed from the mold.

18 Claims, 3 Drawing Sheets

METHOD OF LAMINATING A FLEXIBLE CIRCUIT TO A SUBSTRATE

BACKGROUND OF THE INVENTION

1. Field of the Invention

The present invention relates to a method of manufacturing an electronic circuit assembly from flexible film and an injection molded plastic material. More specifically, the present invention relates to a method of attaching a plastic flexible film to an incompatible plastic material by utilizing an intermediate adhesive layer.

2. Description of the Related Arts

In-molding, insert molding or capture molding are the processes where a flexible film is molded on or into a part or substrate. The process involves the placement of a film(s) into an open mold tool cavity. The film is held in place by features of the film or the mold tool. The mold is closed and the cavity is filled with resin. The resin molds the film onto or into a structure. Typically, the molding process is injection molding but other molding techniques can be used. These in-molded films and resins are typically costly engineering thermoplastics such as polytherimide. These materials are miscible which means that the materials interdiffuse within each other during molding creating a homogeneous film-resin substrate. The film is able to be metallized via lamination and etch or pattern plating with conductive circuit traces making it an electronic substrate. The film can be fabricated with single or double layers of metallization and are metallized through conventional laminating, sputtering, evaporation and embossing, photoimaging, etching and plating processes.

Another in-molding process is called transfer in-molding. This process uses a metallized foil as described above. However, the film resin is not miscible with the molded resin. After the in-molding of the film in the mold, the film is peeled away from the molded substrate leaving the circuit traces mechanically embedded in the molded substrate.

The problem particularly with film insert molding is that there are a limited number of compatible resins and corresponding films made from the resin. These films also tend to be expensive relative to commodity automotive plastics such as ABS and polypropylene. Currently the most widely used capture molding materials system is amorphous polyetherimide (PEI) resin with polyetherimide (PEI) film. Other systems include polyethersulfone (PES), and polysulfone (PS). Typically insert molding systems use the same polymer for both the film and resin. These in-molding resins are also not typically used in any appreciable amount in automotive components.

It is known to manufacture circuit assemblies from flexible films having flexible electronic circuits printed or traced thereon. An example of commercially available films produced by this construction is illustrated in U.S. Pat. No. 5,461,202. Flexible films enable the production of electronic circuit boards into highly contoured three-dimensional shapes. They also allow the electrical circuits to be manufactured separately from the backing structure. This enables the use of different materials for the backing structure and film. One way that flexible films are used is through a process called film capture or in-molding. In-molding refers to the process where a flexible film of either metal, polymer or a combination of both is inserted into a mold and subsequently molded into a circuit assembly.

The film becomes adhered to the backing structure by either mechanical interlocking or an interdiffusion of the resin and polymer film. These films typically contain electrical wiring features or circuits to create a functional electronic module when fully assembled with electronic components.

One example of an electronic circuit made from an in-molding process is illustrated in U.S. Pat. No. 5,118,458 ('458). This reference teaches a method of producing a multi-layer circuit assembly by sequentially building up layers of flexible films. A first flexible film has a circuit traced thereon and a hot-melt adhesive is placed on the reverse side. The film is then placed within a molding tool and a resin is injected against the facing side of the film. The mold is heated to cure the circuit traces. Additional film layers are sequentially added. The hot-melt adhesive does not act to secure the film to the injected resin. Rather, the adhesive is used to attach the various circuit layers to one another.

It is also known to manufacture electronic circuit assemblies by forming a backing only along a portion of a flexible film as shown in U.S. Pat. No. 5,220,488 ('488). The '488 patent teaches placing an elongated film into a mold tool and selecting a plastic resin that fuses to the film. The '488 device does not teach the use of a resin that is incompatible with the films.

There are two major difficulties when attempting to manufacture circuit assemblies made of a flexible film and rigid plastic substrate that are made from incompatible materials. The first problem relates to lamination failure because the film does not adhere or bond to the resin. Dissimilar plastic materials do not intermingle and fuse when melted and have very poor adhesion.

Another difficulty when making the film and substrate from different materials is thermal fatigue placed on the electronic circuits from the different coefficients of thermal expansion (CTE). Different materials have different CTE. The CTE of a material is a measure of the amount of elongation and contraction it undergoes with temperature. When the film and resin are made from different materials, they expand and contract by a different amount with temperature. This difference in expansion and contraction may cause either the film or circuits placed on the film to weaken or fail over time. It is useful to provide an intermediate layer that ameliorates the different expansion and contractions.

These deficiencies and problems are overcome by the present invention.

SUMMARY OF THE INVENTION

The present invention is directed to a method of attaching a flexible plastic film having electronic circuit traces to a rigid plastic substrate. The film and substrate are made from different incompatible plastic materials that do not bond to one another and have different CTE. The use of different or incompatible materials is useful where the properties of the backing structure and film are selected to achieve different results. For example, the flexible film may be selected from a material that provides a high melting point to withstand soldering while the backing material is selected from a low-cost and light weight plastic material that has a lower melting point.

The film has conductive traces on at least one surface thereof and a backing surface. A heat activated adhesive is applied to the backing surface. The film is placed within an open injection mold and the mold is closed. A hot plastic resin is injected into the mold adjacent the adhesive. The resin heats the adhesive above its activation temperature and causes the adhesive to bond to both the backing surface and the plastic resin. The resin is allowed to cool and the finished circuit assembly is removed from the mold.

The invention may utilize either a thermoplastic adhesive or a thermoset adhesive. When using thermoplastic adhesives, the molten plastic resin heats the adhesive above its melting temperature. The adhesive melts and bonds to the film backing surface and resin.

When using thermoset adhesives, a one or two component thermoset is selected to have a B-stage activation temperature at or below the temperature of the injection molded resin. The resin heats the adhesive to a temperature above the activation temperature and causes the adhesive to cross-link and cure.

The invention may also be used to increase the reliability and durability of electronic circuit assemblies having a film and substrate made from different materials. The film and resin generally have different CTE. The adhesive is selected to have a CTE intermediate of the film and resin CTE. This reduces the amount of unwanted elongation or compression transmitted to the circuit traces or electronic components. The present invention has advantages over the prior art because it enables the use of a wider range of materials for the film and substrate and reduces the fatigue exerted on the traces or components. It also has the advantage or utilizing existing molding equipment and conventional materials.

Further objects and advantages of the present invention will become more apparent from the following description in reference to the attached drawings.

DETAILED DESCRIPTION OF THE PREFERRED EMBODIMENTS

Figure 1:
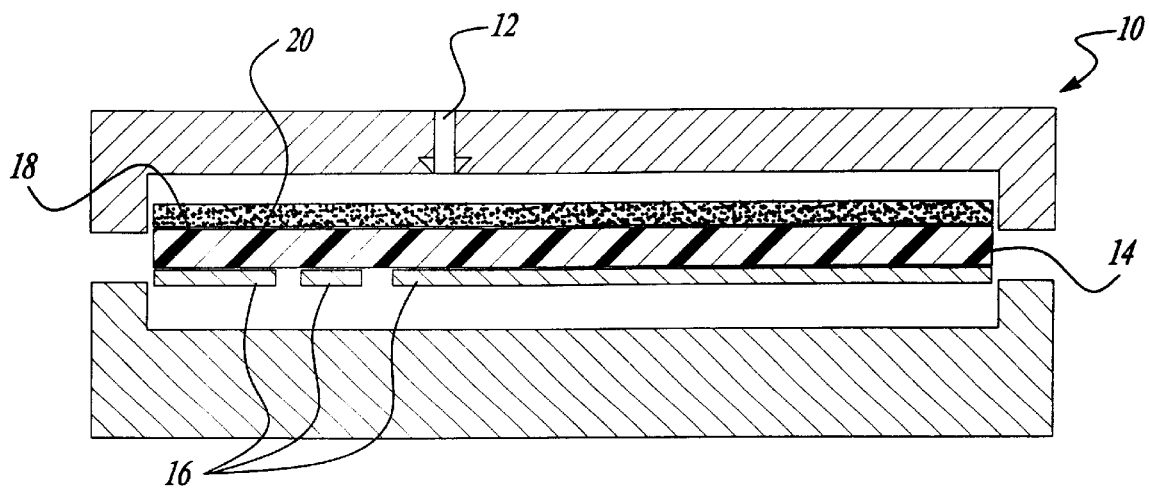
FIG. 1 is a cross-sectional view of a mold with a flexible film having an adhesive backing positioned between the open mold pieces.

The present invention will be described through a series of drawings, which illustrate the manufacture of a circuit assembly made of a flexible film, adhesive and plastic resin substrate. A wide variety of components and shapes may be produced using the methods described.

The following items are a word list of the items described in the drawings and are reproduced to aid in understanding the invention:

10 mold
12 resin inlet
14 film
16 traces
18 backing surface
20 head activated adhesive
22 spacer
26 contoured surface
28 resin The present invention is directed to the fabrication of a multi-layer structure created through film capture or in-molding. In-molding or capture in-molding refers to the process where a flexible film either metal, polymer or a combination of both is inserted into a mold tool and is subsequently molded into a circuit assembly. The flexible film is captured by the injected resin and becomes an integral member of the molded part. The specific invention enables the use of a film and resin made from different and incompatible plastic materials that normally do not intermingle and bond. An intermediate adhesive layer is placed between the film and resin and bonds the two materials.

Due to the lack of compatibility between the film and resin, an adhesive layer between the resin and film is required during the insert molding process. Conventional insert molding requires the interdiffusion of miscible resin and film material during the molding process to create a homogenous intermixed polymer interface. In conventional insert molding, both the resin and film are typically composed of the same polymer. However, the preferred material for the film is PEI is not suitable for use as the resin substrate. Preferred resin materials for use as the substrate include ABS and polypropylene. These materials are incompatible and immiscible with PEI. This is due to the difference in low molding temperatures for the ABS and polypropylene as compared to the much higher melting temperatures of PEI. The present invention enables the use of these different and incompatible materials. Thus, any combination of resin and film can be insert molded and provide a reliable interfacial bond and provide material properties that yield a reliable electronic molded substrate.

Another feature of the present invention is the selection of an adhesive material that bonds the resins and film together such that the adhesive provides a mechanical decoupling and that the insert molded part can be processed through an electronic manufacturing line. This allows for a greater difference in the CTE of the substrate and film.

Typical commodity resins such as ABS, PET, SMA, Nylon and PP are used extensively in structural applications such as the instrument panel, door panel or a package tray in a automobile because of their good physical properties at a low cost. The problem with these low-cost engineered thermoplastic materials is their thermal properties. These resins are typically filled with glass fiber or talc to improve their thermal properties. However, they have large CTE, low heat deflection temperatures (HDTs) and low melting points relative to conventional circuit board substrates. These properties make them generally unsuitable for use with high-temperature electronic circuits. The high CTE and low HDT cause the solder joints to fail before meeting thermal cycle or key life testing requirements. The failure mode is a thermal mechanical fatigue due to the stresses developed in the substrate by the CTE. Therefore the resins must be engineered to meet specific properties. Critical properties of the resins are that they must have a controlled CTE (Coefficient of Thermal Expansion) of 20–35 PPM/°C. in the X and Y direction. The resin must also be able to withstand soldering temperatures and/or conductive adhesive cure. A number of suitable resin materials are commercially available. Of those available, PET, Nylon 6 (PA6) and Ultem™ (PEI) with added fillers were most preferred.

The PET resin contains 55% by volume of chopped glass fibers. The filled PET has a HDT of 260° C. and the CTE is reduced to 25–30 PPM/°C. The Nylon resin contains 35% chopped glass fiber and 20% talc particles. These fillers give this formulation a HDT of 250° C. and a CTE of 35 PPM/°C. A third resin is Ultem™ which is a 30% glass filled polyetherimide (PEI) which has ideal HDT values of 215° C. and a CTE of 35 PPM/°C.

The film material to be insert molded to the resin remained secured to the resin through subsequent soldering and manufacturing operations and throughout the life of the circuit assembly without delaminating and causing a reliability issue with the attached electronic devices or circuits. The area of adherence can be controlled based on the part design to be the entire area at the resin film interface or at non-continuous areas. As described earlier, the film is typically made from polyetherimide (PEI). Unfortunately, due to its cost and physical properties, PEI is generally not suitable for use as the resin substrate material.

The selection of these in-molded films requires that the film and the resin be able to withstand molding temperatures, soldering and/or thermal cure operations and survive thermal cycle and other key life testing. There are numerous polymer films that can be used as the flex circuit substrate such as polyethyleneterephthalate (Mylar™), and polyethylene napthalate (PEN). Some of these materials may be secured to a PEI film using a conventional in-mold process, but then delaminate when subjected to extended temperature cycling. These materials appear to bond after molding but upon further thermal processing (soldering and curing) or thermal shock testing, the films delaminate from the resin creating bubbles, voids and curled edges. These defects are caused by the CTE mismatch between the film and the resin. To resolve this problem, the use of an adhesive decoupling layer is required between the resin and the film.

The adhesive overcomes the adhesion difficulties described. Furthermore, the adhesive mechanically decouples the film from the resin. Even though the modified resins have low CTE, the film material can not be modified with fillers and has a significantly larger CTE than the filled resin, which creates a CTE mismatch. This mismatch is enough to increase the thermal fatigue of solder joints attaching electronic components to the film. Thermal cycle data reproduced below shows that films insert molded to the modified resins described using an adhesive interposing layer exhibit improved reliability. Of the commercially available adhesives, a modified epoxy based system was referred. It is applied to the flex circuit film as a B-stage. During in-molding the adhesive is heated above its activation temperature by the resin and cross-links. The cross-linking cures the adhesive and bonds the film to the resin. This reduces any compatibility issues between film and resin. The adhesive must also have a low elastic modulus to decouple the resin stresses from the solder joints on the flex.

Circuit Assembly Fabrication

Illustrated in FIG. 1 is an injection mold 10 operable between open and closed positions. The mold 10 is one normally used in injection molding operations. The mold 10 includes a resin inlet 12. The resin inlet 12 injects a molten plastic resin into the interior of the mold 10. The mold 10 is illustrated as having a flat planer shape, however contoured articles may also be molded using the invention described.

The invention attaches a flexible film 14 having conductive metal traces 16 and a backing surface 18 to a rigid plastic substrate. The film 14 and the backing surface 18 may be made from a variety of materials, but PEI is preferred and is readily commercially available. A layer of heat activated adhesive 20 is applied to the backing surface 18. The adhesive 20 may be either a hot melt thermoplastic or a thermoset. The adhesive 20 may be dispensed directly atop the backing surface 18, or alternatively may be placed on a transfer sheet and transferred to the backing surface 18. The film 14 with the adhesive 20 is placed within the open mold 10. The adhesive 20 is positioned to receive the molten plastic material.

Figure 2:
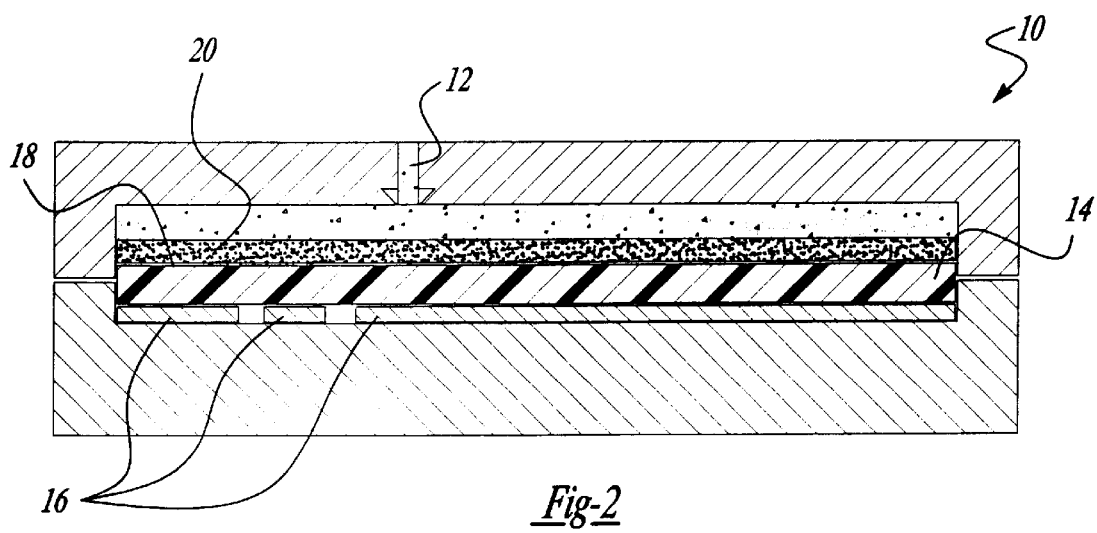
FIG. 2 is a cross-sectional view of the mold illustrated in FIG. 1, undergoing molding.

The mold 10 is moved to the closed position as illustrated in FIG. 2. A hot, molten plastic resin is injected into the mold 10 through the resin inlet 12. The plastic resin heats and activates the adhesive 20. When the adhesive 20 is a thermoplastic, the resin is heated to a temperature above the melting temperature of the adhesive. The resin heats and melts the adhesive and causes the adhesive to bond to the backing surface 20 and the resin. When the adhesive 20 is a thermoset, the resin is heated to a temperature above its B-stage activation temperature. The resin causes the adhesive 20 to cross-link and cure and bond to the backing surface 20 and the resin. In both events, the heat of the resin causes the adhesive to bond to the resin and backing surface. The resin is allowed to cool and the finished circuit assembly is removed from the mold 10.

Figure 3:
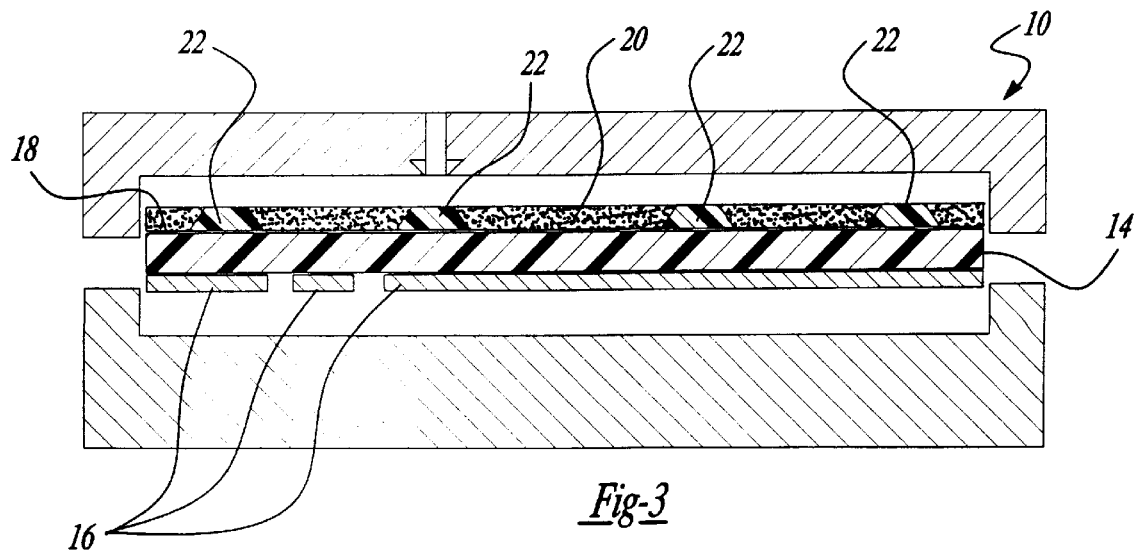
FIG. 3 is a cross-sectional view of an alternative embodiment showing a flexible film having spacers placed within the adhesive backing.
Figure 4:
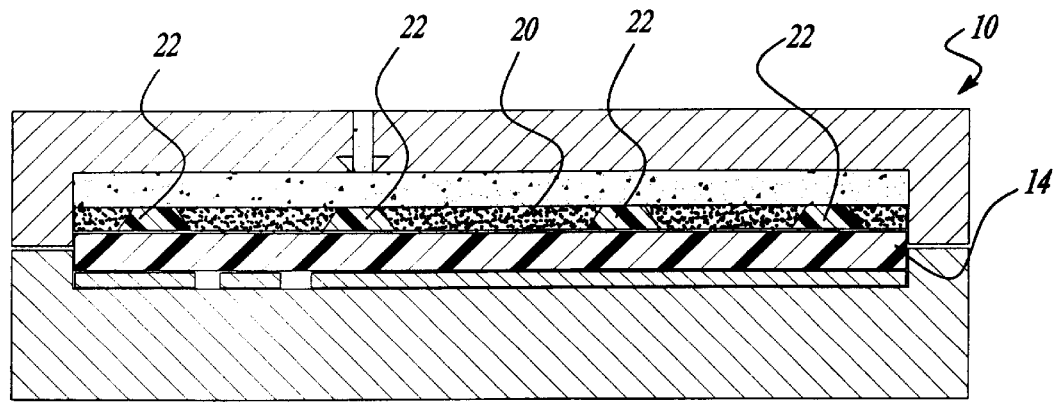
FIG. 4 is a cross-sectional view of the mold illustrated in FIG. 3, undergoing molding.

The embodiment illustrated in FIGS. 3 and 4 is used when a uniform bond thickness underlying the space between the backing surface 18 and the resin is desired. In some circumstances it is advantageous to have the adhesive 20 occupy discrete areas of the backing surface 18. In this event, it is possible to apply spacers 22 to the backing surface 18 as shown in FIGS. 3 and 4. The spacers 22 are attached to the backing surface 22. The spacers 22 may be any type of material, but it is preferable to make it of a plastic resin material compatible with the resin used to manufacture the substrate.

The film 14 is then placed within the mold 10 and resin is injected against the adhesive 20 as described above. The spacer 22 maintains a space between the backing 18 and plastic resin.

Figure 5:
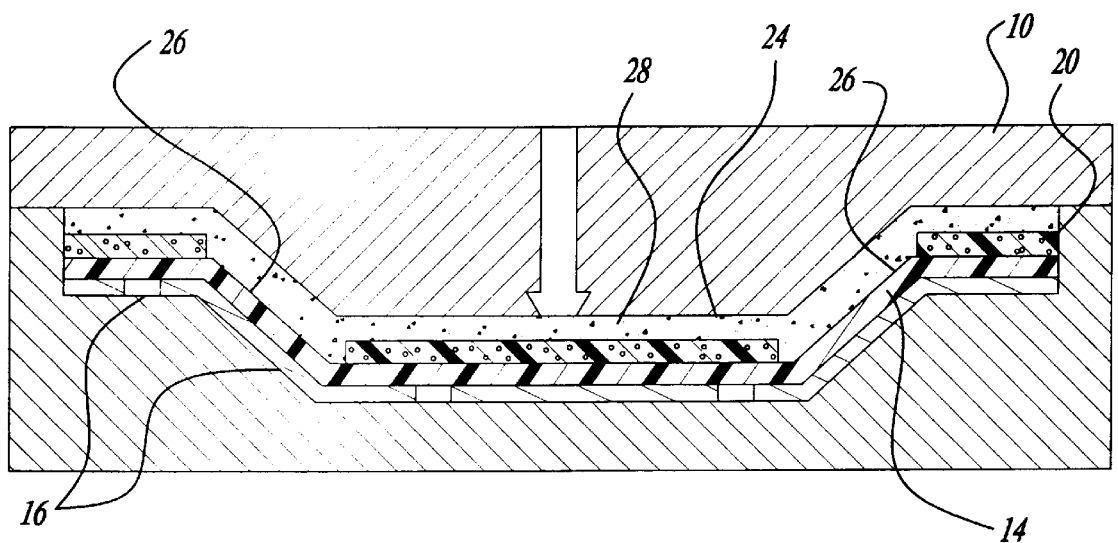
FIG. 5 is a cross-sectional view of an alternative embodiment showing a flexible film having an adhesive backing in a contoured mold undergoing molding.
Figure 6:
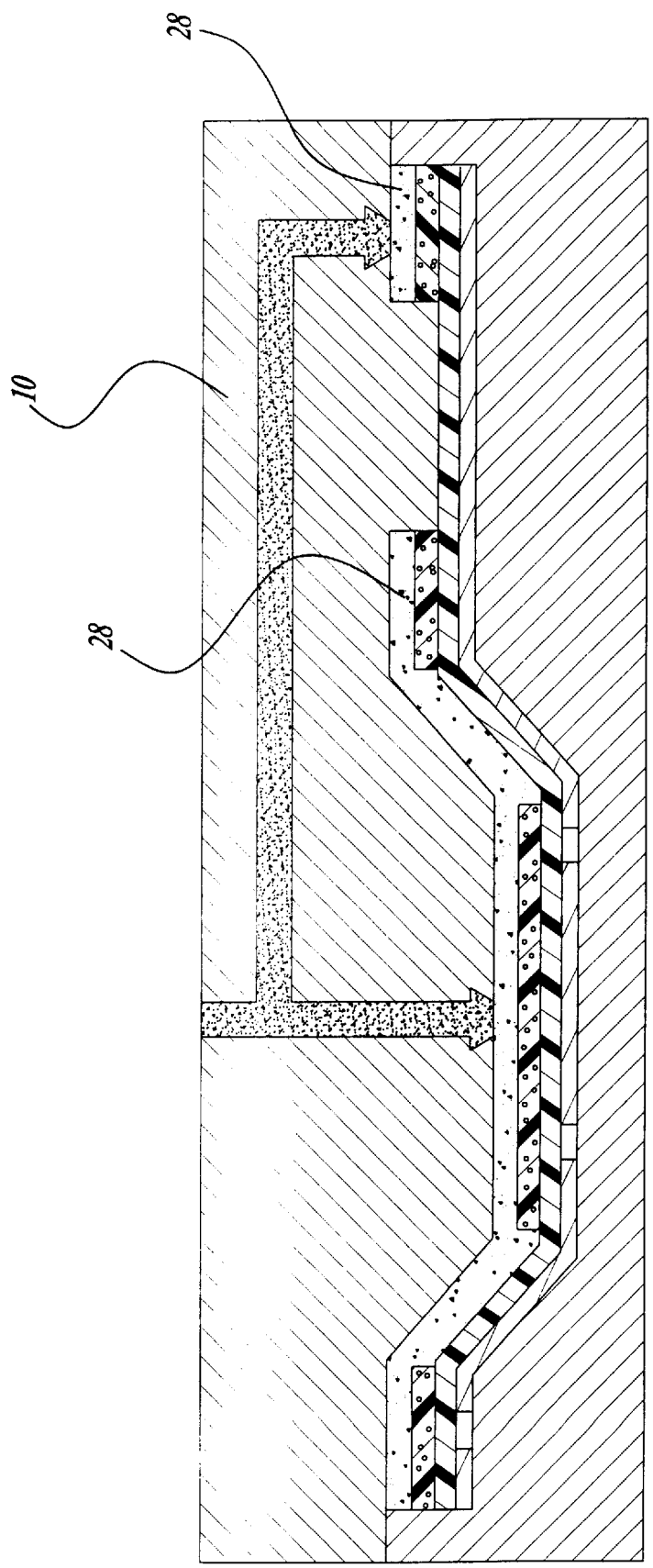
FIG. 6 is a cross-sectional view of an alternative embodiment showing a flexible film having an adhesive backing in a contoured mold undergoing molding.

The embodiment illustrated in FIGS. 5 and 6 is used when a contoured article is desired. The adhesive 20 can be positioned on discrete areas of the backing surface. The resin 28 is adhered to the flexible film 14 by adhesive 20. The adhesive 20 may not cover contoured surface 26. As shown in FIG. 6, the resin 28 can be injected into non-contiguous areas of the mold 10 so that a portion of the flexible film has no resin on it.

EXAMPLES

A part measuring 6" W×11.8" L×1.75" H was used to measure adhesion between the resin and film. After molding and cool down, solder paste was dispensed onto the flex circuit traces and components were placed onto these locations. The part was then reflow soldered through a conventional conveyorized oven. The part was then thermal shock tested to assess the reliability of the film to resin bond and the solder joint. The testing showed that the adhesive interposing layer successfully increased the thermal fatigue life of solder joints on the in-molded flex circuit film.

The three resins were used as the base substrate in this testing and they were polyetherimide (PEI), polyamide (Nylon 6) and polyethylene terephthalate (PET). Three flex film substrates for in-molding were also used in combination with the resins. The three films were PET, polyethylene napthalate (PEN) and PEI, which were all metallized with a test circuit. A modified epoxy adhesive was used. Samples of each material resin, film and adhesive combination was fabricated for the testing. All combinations were successfully fabricated and populated with electronic components prior to testing. The adhesive was applied to the flex circuit as a dry film during the flex circuit fabrication process. Other methods of applying the adhesive include spray coating, roll laminating, manual laminating and fabrication of a separate adhesive film independent of the flex circuit.

The primary testing centered on thermal shock testing and visual inspection of the components and film to resin bond. The thermal shock test was from −55 to 105° C. with a 1 hour cycle with 30 minute dwells at each temperature. This temperature range corresponds to interior locations of a vehicle. The data from this testing is reproduced in the table below. The use of the adhesive layer between the resin and film significantly improves the fatigue life of the solder joints. This holds for the PEI and PET resins with all films.

| Material | PPM/° C. CTE | Modulus |
|---|---|---|
| Flex Adhesive | $325 \times 10^{-6}$ | Very Low |
| Polyethylene Terephtalate Flex Film | $27 \times 10^{-6}$ | Medium |
| Polyethylene Napthalate Flex Film | $20 \times 10^{-6}$ | Medium |
| Polytherimide Flex Film | $54 \times 10^{-6}$ | Medium |
| Polyamide Flex Film | $50 \times 10^{-6}$ | Medium |
| Polytherimide 30% Glass Filled Resin | $35 \times 10^{-6}$ | High |
| Polyamide 6 (Nylon 6) 35% Glass Filled Resin 20% Mineral Filled | $35 \times 10^{-6}$ | High |
| Polyethylene Terephtalate 55% Glass Filled Resin | $30 \times 10^{-6}$ | High |

The present invention, therefore, is well adapted to fulfill the objects, features and advantages outlined above as well as others that are inherent therein. While the invention has been illustrated by its preferred embodiments, other embodiments of the present invention are also possible and are intended to be covered within the spirit and scope of the attached claims.

What is claimed:

1. A method of manufacturing a circuit assembly having a flexible film and a rigid substrate made from a plastic resin comprising the following steps:
   providing a flexible film made from a first plastic resin having conductive circuit traces on at least one surface thereof and a backing surface;
   applying a heat activated adhesive atop said backing surface;
   placing said flexible film within an open mold;
   closing said mold;
   injecting a hot second plastic resin different from said first plastic resin within said mold adjacent said adhesive, said second plastic resin heating said adhesive above said activation temperature and activating said adhesive, said adhesive bonding to said backing surface of said flexible film and to said second plastic resin;
   cooling said second plastic resin and said adhesive; and
   removing said circuit assembly from said mold.

2. The method of claim 1, wherein said adhesive is a thermoplastic.

3. The method of claim 2, wherein said adhesive has a melting temperature lower than the melting temperature of said resin and said injected resin causes said adhesive to melt.

4. The method of claim 2, further comprising heating said plastic resin to a temperature above the melting temperature of said adhesive and causing said adhesive to melt.

5. The method of claim 1, wherein said adhesive is a thermoset.

6. The method of claim 5, wherein said adhesive has an activation temperature lower than the melting temperature of said resin and said injected resin causes said adhesive to activate.

7. The method of claim 5, further comprising heating said plastic resin to a temperature above the activation temperature of said adhesive and causing said adhesive to activate.

8. The method of claim 7, wherein said activated adhesive cross-links and cures.

9. The method of claim 1, further comprising placing spacer on said backing surface spacing said film a fixed distance away from said resin.

10. A method of manufacturing a circuit assembly having a flexible film having a first CTE and a rigid substrate having a second CTE different from said first CTE comprising the following steps:
    providing a flexible film having conductive circuit traces on at least one surface thereof and a backing surface;
    applying a heat activated adhesive atop said backing surface, said adhesive having a third CTE intermediate of said first and second CTE;
    placing said flexible film within an open mold;
    closing said mold;
    injecting a hot plastic resin within said mold adjacent said adhesive, said resin heating said adhesive above said activation temperature and activating said adhesive, said adhesive bonding said flexible film to said resin;
    cooling said plastic material; and
    removing said circuit assembly from said mold.

11. The method of claim 10, wherein said adhesive is a thermoplastic.

12. The method of claim 11, wherein said adhesive has a melting temperature lower than the melting temperature of said resin and said injected resin causes said adhesive to melt.

13. The method claim 11, further comprising heating said plastic resin to a temperature above the melting temperature of said adhesive and causing said adhesive to melt.

14. The method of claim 10, wherein said adhesive is a thermoset.

15. The method of claim 14, wherein said adhesive has an activation temperature lower than the melting temperature of said resin and said injected resin causes said adhesive to activate.

16. The method of claim 14, further comprising heating said plastic resin to a temperature above the activation temperature of said adhesive and causing said adhesive to activate.

17. The method of claim 16, wherein said activated adhesive cross-links and cures.

18. The method of claim 10, further comprising placing spacer on said backing surface spacing said film a fixed distance away from said resin.

* * * * *